(12) United States Patent
Greenwood et al.

(10) Patent No.: US 7,012,970 B2
(45) Date of Patent: Mar. 14, 2006

(54) METHOD AND APPARATUS FOR REDUCING TRANSMITTER PEAK POWER REQUIREMENTS

(75) Inventors: William C. Greenwood, Trophy Club, TX (US); Ronald L. Porco, Fort Worth, TX (US); Glen A. Franson, Fort Worth, TX (US)

(73) Assignee: Motorola, Inc., Schaumburg, IL (US)

(*) Notice: Subject to any disclaimer, the term of this patent is extended or adjusted under 35 U.S.C. 154(b) by 715 days.

(21) Appl. No.: 10/101,634

(22) Filed: Mar. 19, 2002

(65) Prior Publication Data
US 2003/0179832 A1 Sep. 25, 2003

(51) Int. Cl.
*H04L 25/03* (2006.01)
(52) U.S. Cl. .................................... 375/296
(58) Field of Classification Search ........ 375/295–297, 375/130, 146, 140; 398/193; 455/114.3; 370/321, 335, 336, 342, 344, 347, 441, 442
See application file for complete search history.

(56) References Cited

U.S. PATENT DOCUMENTS

| 5,287,387 | A | | 2/1994 | Birchler et al. ............. 375/332 |
| 5,604,462 | A | | 2/1997 | Gans et al. ................. 330/330 |
| 5,638,403 | A | | 6/1997 | Birchler et al. ............. 375/332 |
| 5,783,969 | A | | 7/1998 | Luz ............................ 330/330 |
| 5,834,972 | A | | 11/1998 | Schiemenz, Jr. et al. ... 330/330 |
| 5,920,808 | A | * | 7/1999 | Jones et al. ............... 455/127.1 |
| 5,933,766 | A | | 8/1999 | Dent .......................... 455/455 |
| 6,128,351 | A | * | 10/2000 | Jones et al. ................. 375/284 |
| 6,381,212 | B1 | * | 4/2002 | Larkin ........................ 370/210 |
| 2002/0118767 | A1 | * | 8/2002 | Ylamurto .................... 375/261 |

FOREIGN PATENT DOCUMENTS

EP 0966099 A1 12/1999

* cited by examiner

*Primary Examiner*—Tesfaldet Bocure
(74) *Attorney, Agent, or Firm*—Kevin D. Wills

(57) ABSTRACT

A peak to average reduction apparatus and method thereof for reducing peak power requirements of a multi-channel transmitter is discussed. The apparatus includes: a Fourier Transform Matrix (FTM) coupled to one or more input signals for providing a plurality of output signals each comprising a combination of phase shifted versions of the one or more input signals; and a processing unit coupled to the output signals for limiting a peak value for each of the output signals to provide a plurality of peak limited output signals, wherein the peak limited output signals are suitable for generating a plurality of signals for driving the multi-channel transmitter. A transmitter further includes a power amplifier having a plurality of amplifiers coupled to these signals, each amplifier coupled to a one of the signals that correspond to one of the peak limited output signals to provide an amplified output signal, wherein the plurality of amplifiers provide a plurality of amplified output signals; and a radio frequency FTM coupled to the amplified output signals to provide one or more transmit signals corresponding one to one with the input signals.

9 Claims, 3 Drawing Sheets

TRACE 1 PAR @ 0.01%= 9.75dB
TRACE 2 PAR @ 0.01%= 4.57dB
TRACE 3 PAR @ 0.01%= 5.62dB
TRACE 4 PAR @ 0.01%= 4.66dB dence of this application and all equivalents of those claims
METHOD AND APPARATUS FOR REDUCING TRANSMITTER PEAK POWER REQUIREMENTS

FIELD OF THE INVENTION

This invention relates in general to communication systems, and more specifically to a method and apparatus for reducing peak power requirements in transmitters within such systems.

BACKGROUND OF THE INVENTION

Communications systems and particularly wireless communications systems require transmitters in one form or another. Transmitters and particularly higher power transmitters, specifically power amplifiers (PAs) are one of the more expensive and more highly stressed, from a power perspective, components of a communications system. By virtue of the PAs relatively intimate coupling to an antenna system they are subject to abuse due, for example, to antenna irregularities, such as mismatches and weather or lightning events. For these reasons transmitters or power amplifiers are subject to or often experience relatively higher failure rates than some system components. These higher power transmitters are typically found in base stations. Base stations, such as those found in cellular or like communications system are a key link in providing satisfactory service for hundreds and possibly thousands of customers.

Therefore carriers or service providers or network operators cannot afford to have a transmitter failure and will go to great lengths to avoid failures or at least service outages when there is a failure. Hence most base station suppliers utilize some form of redundancy for power amplifiers within the base stations they provide to the marketplace. More recently some manufacturers have been using radio frequency Fourier Transform Matrices (FTMs) to provide this redundancy. FTMs combine phase shifted versions of input signals to provide multiple output signals which are then amplified and passed through another radio frequency FTM to decompose the amplified signals into amplified versions of the original input signals. Thus if a PA fails, the remaining PAs will continue to amplify the input signals and provide amplified signals thus avoiding service outages. This may be more economical than having full redundancy for each power amplifier. However, there is still a problem.

Many communications systems today require linear PAs because they rely on complex modulation schemes that specify amplitude and phase variations in the transmitted radio signals. Even systems that do not per se require linear PAs, but use FTMs, will find amplitude variations in the combined phase shifted signals that are to be amplified and thus need linear PAs. Linear PAs are very difficult and expensive to construct. Limiting the range of output, thus input, signals over which the amplifier must demonstrate a degree of linearity can control or contain costs and difficulties. In conventional amplifier systems there are known techniques for processing the input signals to assist with these goals, however there are no known techniques that work when FTMs are employed. What is needed is a method and apparatus for reducing peak power requirements in transmitters, specifically multi-channel transmitters using FTMs.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF PREFERRED EMBODIMENT

In overview form the present disclosure concerns communications systems that utilize transmitters to provide service to communications units or more specifically user thereof operating therein. More particularly various inventive concepts and principles embodied in methods and apparatus for the reduction of peak power requirements for transmitters are discussed and disclosed. The communications systems of particular interest are those being deployed such as GSM, GPRS, EDGE, TETRA, iDEN, CDMA, W-CDMA, CDMA2000, 2.5G, or 3G systems that use modulation formats such as QPSK, DQPSK, OQPSK, BPSK, QAM, and spread spectrum or variations and evolutions thereof that require cost effective high availability transmitters.

As further discussed below various inventive principles and combinations thereof are advantageously employed to essentially construct and process at base band the signals that the amplifiers will encounter, thus alleviating various problems associated with known systems while still facilitating cost effective, high performance and high availability transmitters provided these principles or equivalents thereof are utilized.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in software programs or instructions and integrated circuits (ICs) such as application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore further discussion of such software and ICs, if any, will be limited in the interest of brevity and minimization of any risk of obscuring the principles and concepts in accordance with the present invention.

Figure 1:
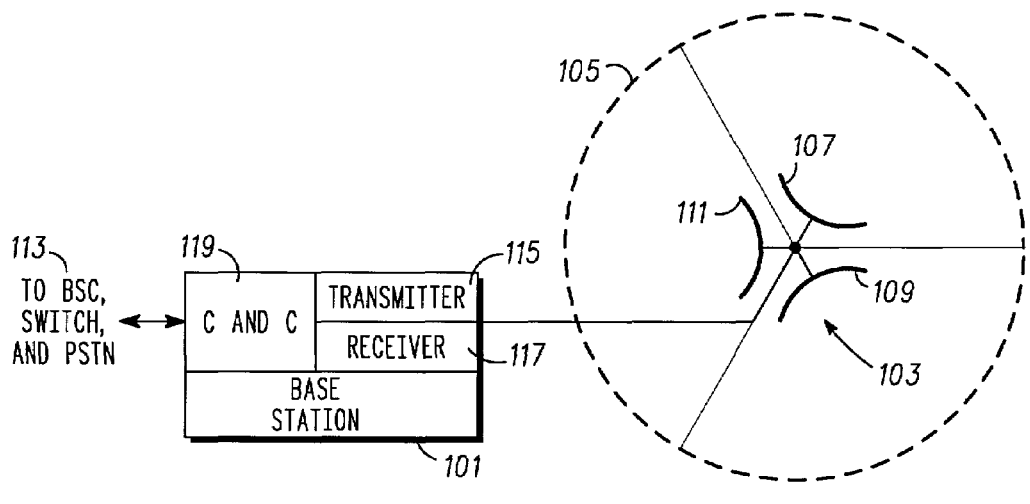
FIG. 1 depicts a simplified diagram of a portion of a communications system suitable for employing an embodiment according to the present invention.

Referring to FIG. 1 a simplified diagram of a portion 100 of a communications system will be described. FIG. 1 shows a base station 101 inter-coupled to an antenna system 103 to provide coverage to users within the general coverage area 105. The antenna system 103, depicted, is a sector gain system with 3 sectors 107, 109, 111 depicted, each covering, nominally, 120 degrees, although other arrangements such as 6 sectors, etc. would be appropriate. Ordinarily the base station will supply entirely different signals to each sector of the antenna and possibly multiple signals to one or more of the sectors. Even when an omni directional antenna is used the station will often need to supply multiple signals to the omni directional structure. In any event the base station is further coupled at 113 to a base site controller and switch and eventually the Public Switched Telephone System typically via a dedicated link such as a T1 terrestrial link or the like.

Essentially the base station handles the radio links to and from subscriber devices or users of portable or mobile equipment and the land or terrestrial based portions of the systems or networks. Generally the base stations can be thought of as including and inter-coupled a communications and control function 119, a receiver function 117 and a transmitter function 115. Each of these functions can be quite complex in there own right and comprise redundant systems. The receiver and transmitter functions or blocks will inevitably include tens of receivers and transmitters. These stations and antenna systems are generally known and available from multiple suppliers, such as Motorola, etc., and when the transmitters are modified and constructed according to the principles and concepts disclosed herein improved performance and cost advantages can be realized.

Figure 2:
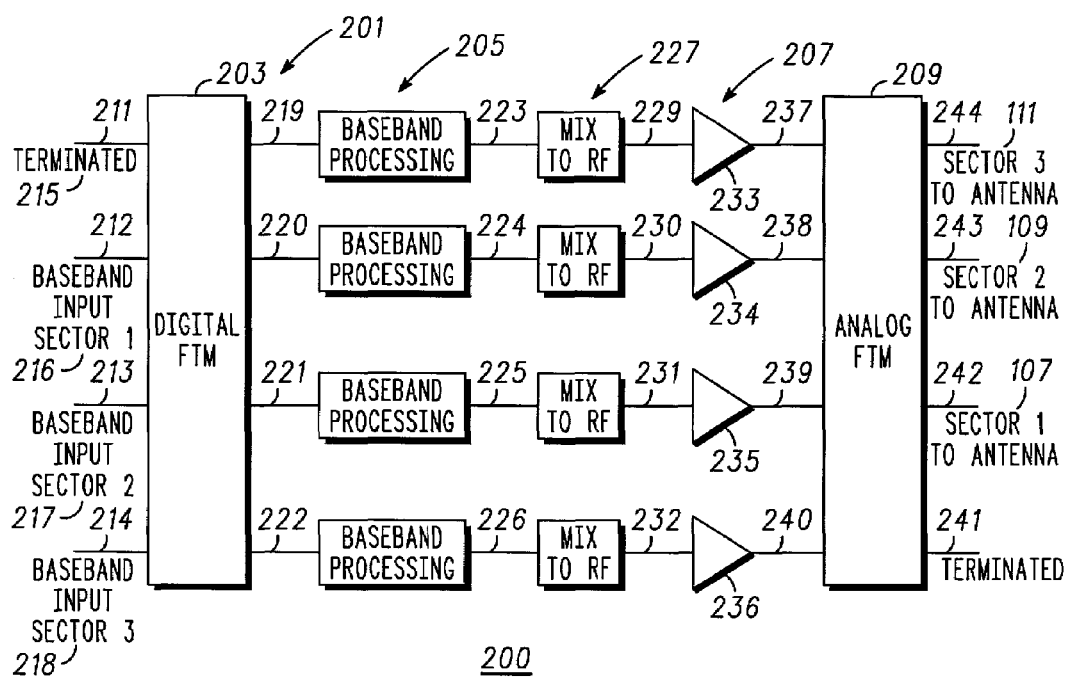
FIG. 2 depicts a simplified block diagram of a preferred embodiment of a transmitter according to the present invention.

Referring to FIG. 2, a simplified block diagram of a preferred embodiment of a transmitter 200 will now be discussed and described. The FIG. 2 transmitter is a multi-channel transmitter having reduced peak power requirements. Multi-channel transmitter is used to describe a transmitter having multiple parallel paths and amplifier stages such as may be encountered or may be particularly well suited for amplifying signals produced by a Fourier Transform Matrix (FTM) or for driving a FTM. Generally the reduced peak power requirement is accomplished by limiting the peak to average ratios (PARs) for the signals that are presented to the amplifiers, then amplified, and thus the amplified signals. The peak to average is limited at base band but rather than limiting the PAR of the input signals as is traditional they are first processed through a base band FTM.

The multi-channel transmitter having reduced peak power requirements includes a peak to average reduction apparatus 201. This apparatus includes a Fourier Transform Matrix (FTM) 203 coupled to at least one input signal and from there coupled to a processing unit 205 that limits peak values and provides peak limited output signals to a mixer 227. The mixer converts these base band signals to a radio frequency and these signals are amplified by an amplifier 207 and then decomposed or perhaps more accurately re-composed at or by a radio frequency or analog FTM to provide at least one transmit signal.

In more detail the FTM 203, preferably a digital FTM implemented in software via a Digital Signal Processor (DSP) or an Application Specific Integrated Circuit (ASIC) or combination thereof, is coupled to the at least one input signal 212 and preferably a plurality of such signals 211–214 and provides a plurality of FTM output signals 219–222, where each of the FTM output signals comprises a combination of phase shifted versions of the at least one input signal and preferably plurality of input signals according to generally known FTM techniques. Note that as depicted input 211 is terminated, while inputs 212–214 are shown respectively as base band input signals 216–218 for sector 1–sector 3. The input signal or signals is preferably a base band signal or signals intended for transmission on one or more radio channels with a channel here being interpreted as one or more carriers intended to provide coverage in a particular coverage area. A typical example would be a plurality of input signals each comprising a code division, time division, or frequency division multiple access base band signal intended for transmission, on one or more carrier frequencies, within one sector of a plurality of sectors, such as 107, 109, or 111. Although this may be typical the principles and concepts herein discussed will have application and be equally advantageous, regardless of the particular form of modulation and channel access employed provided of course that the modulation will withstand or to the extent that the modulation can withstand the inevitable distortion that results from the peak limiting action. For example, besides CDMA the modulation and access methodologies, such as TDMA or FDMA, thus base band signals, used variously for GSM, GPRS, EDGE, TETRA, iDEN, CDMA, W-CDMA, CDMA2000, 2.5G, or 3G will work equally well.

The processing unit 205 includes a plurality of base band processing functions (four depicted) that are each coupled to one of the plurality of FTM output signals. The processing unit operates to process the FTM signal in a manner that makes it more compatible with or less demanding on a linear power amplifier. One example of such processing is limiting a peak value or all peak values for each of the plurality of FTM output signals to provide a plurality of peak limited output signals 223–226. As will be discussed in more detail with reference to FIGS. 3–6, a preferred approach for doing this limiting is through the use of a clipping function that operates to limit peaks of each of the FTM output signals. Preferably this clipping function is a so called windowed clipping function that operates to limit peaks according to a predetermined function that lowers the probability that a peak value will exceed a predetermined value for each of the output signals.

It has been shown that further improvement in performance of the amplifiers or transmitter can be realized if the clipping function is followed by a filter that is coupled to an output of the clipping function to reduce undesired signals resulting from the clipping function. Additional improvement has been realized in some instances when the filter is followed by a second clipping function that is coupled to an output of the filter and that operates to further limit peaks of a filtered version of each of the FTM output signals. This is usually considered a light clipper in that a comparatively smaller percentage of peaks are clipped or limited.

Further included in the multi-channel transmitter is the power amplifier 207 that has a plurality of amplifiers 233–236 coupled to a plurality of signals 229–232, each amplifier having an input coupled to one of the signals where each of these signals correspond to one of the peak limited output signals and operable to provide an amplified output signal, wherein the plurality of amplifiers provide a plurality of amplified output signals 237–240, respectively. A preferred approach for providing the signals includes a mixer 227 or plurality of mixers coupled to the plurality of peak limited output signals to convert the peak limited output signals to provide the plurality of signals for the amplifier inputs. Each of the peak limited output signals is converted from a base band frequency or bit rate of a few megabits per second to an analog signal at a transmission radio frequency of, for example, either 800 to 1000 MHz or 1.8 GHz to 2.2 GHz or more. The mixers include known digital to analog converters with appropriate filtering followed by a mixer driven by a local oscillator (none specifically shown).

One last element of the transmitter is a radio frequency or analog FTM that is coupled to the plurality of amplified output signals 237–240 to provide at least one transmit signal 242 corresponding one to one with the at least one input signal 212 and preferably a plurality of transmitter signals 241–244 corresponding one to one with the input signals 211–214. Thus 241 is shown terminated while 242–244 provide signals for or to sector1–sector 3 of the antenna. The reversal in order is a result of going through two FTMs. Note that while this disclosure has been developed around the use of 4×4 matrices the principles and concepts disclosed and described apply to essentially any size matrix and the matrix need not be square as here. Analog FTMs are known and available in various dimensions such as here a 4×4 matrix from suppliers such as Anaren Microwave. The FTM is a series of hybrid combiners that combines the input signals at specific phase angles. The typical bandwidth for the matrix is 200 MHz with an insertion loss of 0.5 dB.

In any event, as described and discussed the multi-channel transmitter is preferably arranged and constructed for transmitting code division, time division, or frequency division multiple access signals on multiple sectors. The input FTM is, preferably, a digital FTM with one or more base band input signals, while the processing unit includes, preferably, a windowed clipping function, and the radio frequency FTM that is an analog FTM. In this fashion the base band signals are processed at base band in a form that represents the signals input to the plurality of radio frequency amplifiers in order to limit the demands on the plurality of power amplifiers thus reducing the peak power requirements for the multi-channel amplifier. A couple of factors related to apparent cost and complexity of this approach suggest that it is far from intuitive. For example the digital FTM appears to be an extra cost and also note that with the FTM depicted where basically 3 signals are input to a 4×4 matrix four mixer line ups are required in order to convert the composite or peak limited output signals to radio frequencies whereas in a conventional approach only one mixer per input signal would be required.

Figure 3:
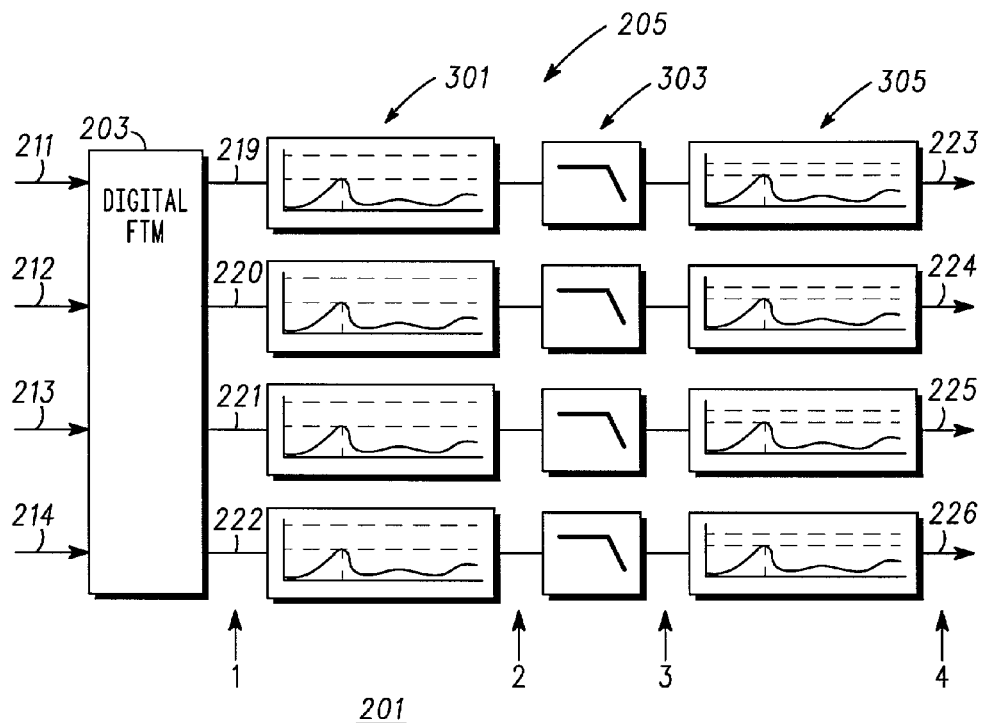
FIG. 3 illustrates a block diagram of a preferred embodiment of a peak to average reduction apparatus suitable for use in the FIG. 2 transmitter in accordance with the present invention.

Referring to FIG. 3, a block diagram of a preferred embodiment of a peak to average reduction apparatus 201 suitable for use in the transmitter described above will now be discussed and described. Some of this discussion will be in the nature of a review while some will elaborate on various functions and processes described briefly earlier. The peak to average reduction apparatus 201 is for reducing peak power requirements of a multi-charnel transmitter and it does so by reducing Peak to Average Ratios (PARs) of signals that are representative in amplitude characteristics of the signals that will be applied to each power amplifier in the multi-channel transmitter. The apparatus includes the Fourier Transform Matrix (FTM) 203, mentioned above, that is coupled to at least one input signal 212 and preferably a plurality of input signals 211–214. The FTM is, preferably a digital FTM, for providing a plurality of output signals 219–222 where each comprises a combination of phase shifted versions of the one or more input signals. Additionally included in the apparatus 201 is the processing unit 205 that is coupled to the plurality of output signals 219–222 that operates to or for limiting a peak value for each of the plurality of output signals in order to provide a plurality of peak limited output signals 223–226. The peak limited output signals are suitable for generating using foe example the mixer discussed above, a plurality of signals or low-level signals for driving amplifiers in the multi-channel transmitter.

The peak to average reduction apparatus, specifically the digital FTM is preferably coupled to a plurality of input signals each comprising a base band signal, such as a code division, time division, or frequency division multiple access base band signal, intended for transmission on a radio channel such as on one sector of a plurality of sectors or one sector antenna or a multiple sector antenna structure. Note one base band signal for CDMA as is known can include pilot, paging, and sync signals, and as many as 61 voice or data payload signals for each of multiple carriers. A typical bit rate for a IS-95 base band signal is approximately 1.3 M bits per second and other versions of CDMA can go much higher.

As depicted the apparatus or processing unit 205, preferably, includes a clipping function 301 comprising, but not limited to, four blocks or one per output signal, that operates to limit peaks of each of output signals. This clipping function 301 is preferably a windowed clipping function that operates to perform a relatively heavy clip to limit peaks according to a predetermined function that lowers the probability that peak values will exceed a predetermined value for each of the output signals. Following the clipping function is preferably a filter 303 coupled to an output of each of the clipping functions 301 and operating to reduce undesired and higher frequency signals resulting from the clipping function. Following the filter is, preferably, a second clipping function 305 coupled to an output of each of the filters 303 that operates to further limit peaks of each of the output signals 223–226. Advantageously the peak to average reduction apparatus 201 is suitable for implementation in an integrated circuit form as either a DSP or ASIC or combination of both as will be recognized by one of ordinary skill given the principles and concepts disclosed herein.

A 4×4 digital FTM can be described by the following matrix:

|  | Vout1 | Vout2 | Vout3 | Vout4 |
| --- | --- | --- | --- | --- |
| Vin1 | 0.5∠0 | 0.5∠−90 | 0.5∠−90 | 0.5∠−180 |
| Vin2 | 0.5∠−90 | 0.5∠−180 | 0.5∠0 | 0.5∠−90 |
| Vin3 | 0.5∠−90 | 0.5∠0 | 0.5∠−180 | 0.5∠−90 |
| Vin4 | 0.5∠−180 | 0.5∠−90 | 0.5∠−90 | 0.5∠0 |

This can also be represented by the equations:

$$Vout1 = 0.5 \cdot Vin1\angle 0° + 0.5 \cdot Vin2\angle -90° + 0.5 \cdot Vin3\angle -90° + 0.5 \cdot Vin4\angle -180°$$

$$Vout2 = 0.5 \cdot Vin1\angle -90° + 0.5 \cdot Vin2\angle -180° + 0.5 \cdot Vin3\angle 0° + 0.5 \cdot Vin4\angle -90°$$

$$Vout3 = 0.5 \cdot Vin1\angle -90° + 0.5 \cdot Vin2\angle 0° + 0.5 \cdot Vin3\angle -180° + 0.5 \cdot Vin4\angle -90°$$

$$Vout4 = 0.5 \cdot Vin1\angle -180° + 0.5 \cdot Vin2\angle -90° + 0.5 \cdot Vin3\angle -90° + 0.5 \cdot Vin4\angle 0°$$

Either the matrix or the equations show the relationship between the output signals Vout and input signals Vin. It turns out to be reasonably straight forward to perform these calculations in a DSP.

Figure 4:
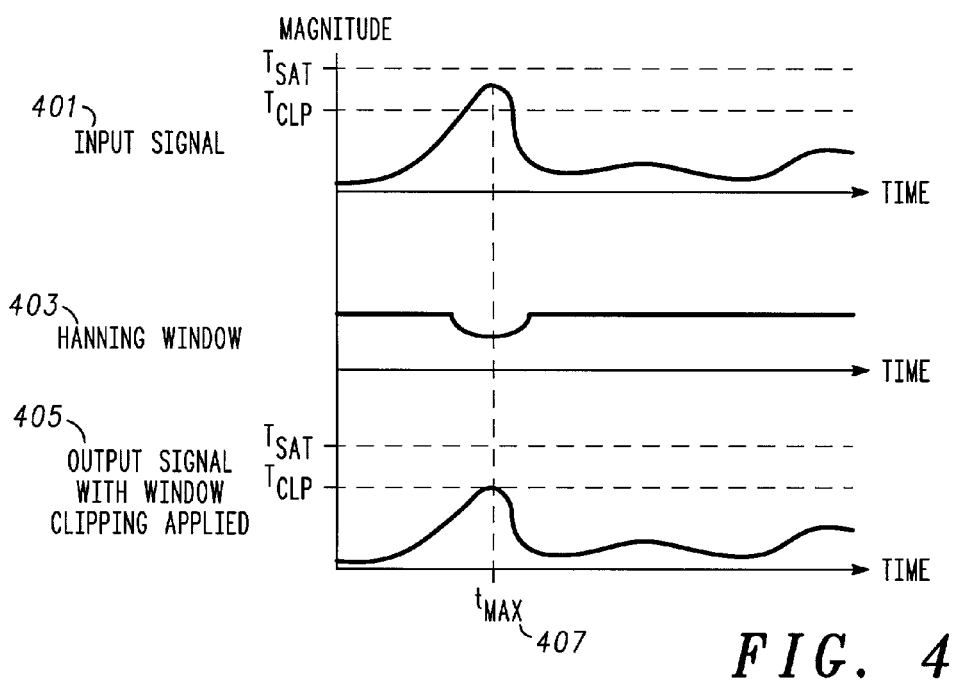
FIG. 4–FIG. 6 depict some operating waveforms and performance graphs of the FIG. 3 apparatus.

The clipping functions will now be described in more detail with reference to FIG. 4. First we will discuss some definitional material to give the reader a better appreciation for the clipping processes. The crest factor of a signal is defined as the ratio of peak power to average power. Although it is useful to know the peak-to-average ratio (PAR) of a signal, the cumulative distribution function (CDF) provides better insight as to the true statistical nature of the envelope power. The CDF and the complementary cumulative distribution function CCDF are defined by the following equations.

$$CDF = F(x) = \int_{-\infty}^{x} f(\xi)d\xi$$

$$CCDF = 1 - F(x)$$

Essentially, the CCDF is a plot of the PARs from 0 to 100%. It is convenient to work in terms of distribution functions since the peak level and the amount of time spent at and above the crest factor is important. Simply stated, the shape of the CCDF is important. For the purposes of this disclosure, crest factor will be defined as the PAR at 0.01%. For example, a 10 dB PAR will imply that there is a 0.01% probability that a signal power will be greater than 10 dB above the average power.

It is desirable that the clipping function limit the peaks of the signal and at the same time generate as little noise or splatter or undesirable signal power as possible. To produce a low splatter clip it is important that the discontinuities in the waveform be minimal. The windowed clipping algorithm is an excellent approach to satisfying these objectives. The clipping is implemented digitally in base band processing so that the data may be processed in non-real time. Various forms of windowed clipping algorithms will suit the purposes. Referring to FIG. 4 an algorithm is described that uses two thresholds to limit the peaks of the signal 401. The soft clipping threshold is designated as Tclp while the hard clip threshold is called Tsat. The user determines the values of these thresholds experimentally based on a particular system set up. The first step in the window clipping algorithm is to scan the input waveform for peaks that exceed the clip thresholds. Once the peak of a signal exceeding the thresholds has been identified either a hard clip or soft clip will be applied. The peak index in FIG. 4 is designated as $t_{max}$ 407. In the case of a soft clip the peak portion of the waveform is convolved with an inverted Hanning window 403. Various other types of windows will also work properly as those of ordinary skill in the art will realize. The equations below show the Hanning window, $h_j$, the window clipping function, $w_j$, and the window length, L.

$$h_j = [1 - \cos(2\pi j/(L-1))]/2$$

$$w_j(n) = 1 + (c-1) \cdot h_j$$

$$j = 0, 1, 2, \ldots, L-1$$

The window clipping function is calculated such that the peak at $t_{max}$ will be equal to the Tclp level after the window and signal have been convolved and this is shown at 405. Therefore, for any peak that exceeds Tclp but is less than Tsat a custom window will be calculated and applied to reduce the local maximum to the Tclp level. Substituting the following weight into the equation above will calculate the desired window function.

$$c = \sqrt{T_{CLP}}/|Input\_Signal(t_{max})|$$

There will be some discontinuities around the peak region since only that portion of the signal is being filtered but they should be substantially less than those associated with a hard clip.

At some point one may find that the window clipper is working so hard that it is producing as much splatter as a hard clip. If this is the case, then using a constant clipping weight rather than a variable clipping weight will be the best measure. The equation below describes the clipping weight for such a case.

$$c = \sqrt{T_{CLP}/T_{SAT}}$$

In the case of a hard clip the signal value will be changed to match the Tclp threshold.

The filter 303 was implemented in DSP form to have the following characteristics. The filter should have a flat pass band to preserve the characteristics of other channel or pulse shaping filters. In addition a steep transition band and adequate attenuation are needed to ensure that the filtered waveform will meet channel specifications.

Figure 5:
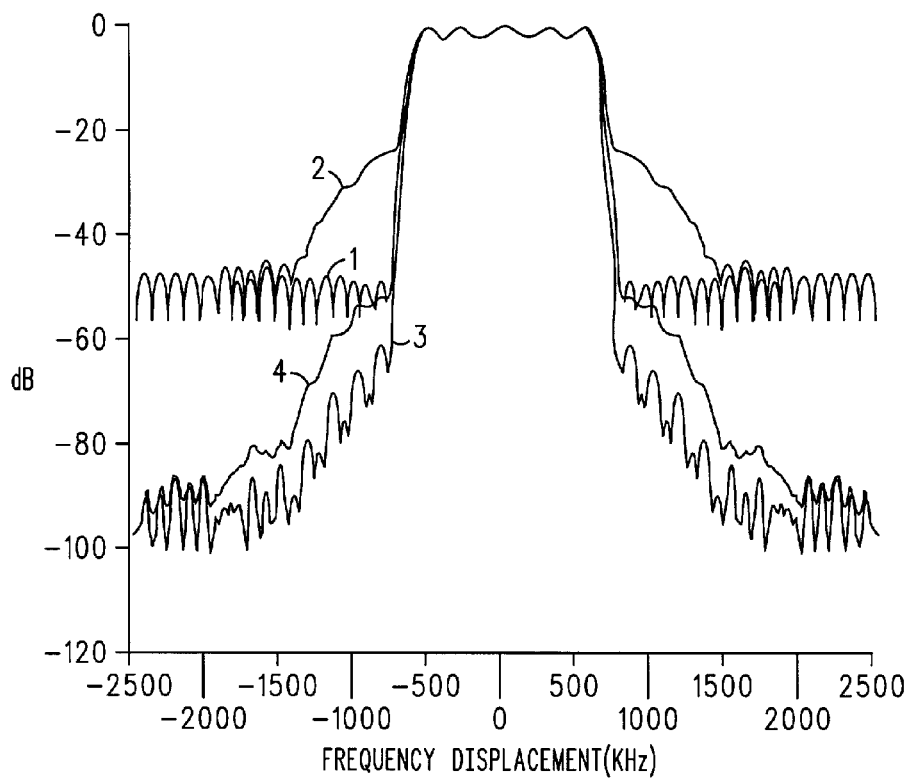

Referring to FIG. 5 the power spectral densities for the points marked 1–4 in FIG. 3 are shown. Recall that in the apparatus 201 of FIG. 3 two clipping functions are employed. The first clipping function's threshold value is set to a low level to produce a heavy clip. The output of the first clipper is filtered to eliminate the splatter that is generated from the heavy clipping function. After filtering, the resultant signal is clipped again. The second clipping function's threshold is set to clip the signal very lightly. There will be some spectral re-growth due to the second clip but it should be acceptable since the clip is light. This method allows the user to increase the peak-to-average ratio reduction at the expense of a slight degradation in adjacent channel power (ACP) at the power amplifiers respective inputs. However, if the power amplifier is operated at its rated power then it is likely that the non-linearities of the power amplifiers will produce adjacent channel splatter that exceeds that of there respective input signals. Therefore, the actual ACP performance seen at the antenna output may not be degraded at all by the inclusion of the second clipping function. On the contrary, the PAR reduction resulting from the second clipping function may result in an improved ACP at the antenna output even though the ACP at the power amplifier input is degraded.

Using the input to the first window clipper, the waveform designated 1, as the reference, one can see how the standard IS-95 channel filter with a 3 dB corner frequency of 590 KHz and 45 dB of attenuation has shaped the spectrum prior to any window clipping or further filtering. The PAR at 0.01% of the original signal is 9.75 dB. Clipping the signal, using clipping function 301, from a 0.01% PAR of 9.75 dB down to 4.57 dB results in a rise of the out-of-band energy as shown by the waveform designated 2. The clipped signal is then filtered with the resulting spectrum shown by the waveform designated 3. While the ACP is good after the filtering, the peak-to-average ratio has increased to 5.62 dB at 0.01%. Clipping the signal a second time brings the 0.01% PAR back down to 4.66 dB, but produces additional splatter as shown by the waveform designated 4. Note that the splatter is still lower than the original noise floor established by the channel filter.

Figure 6:
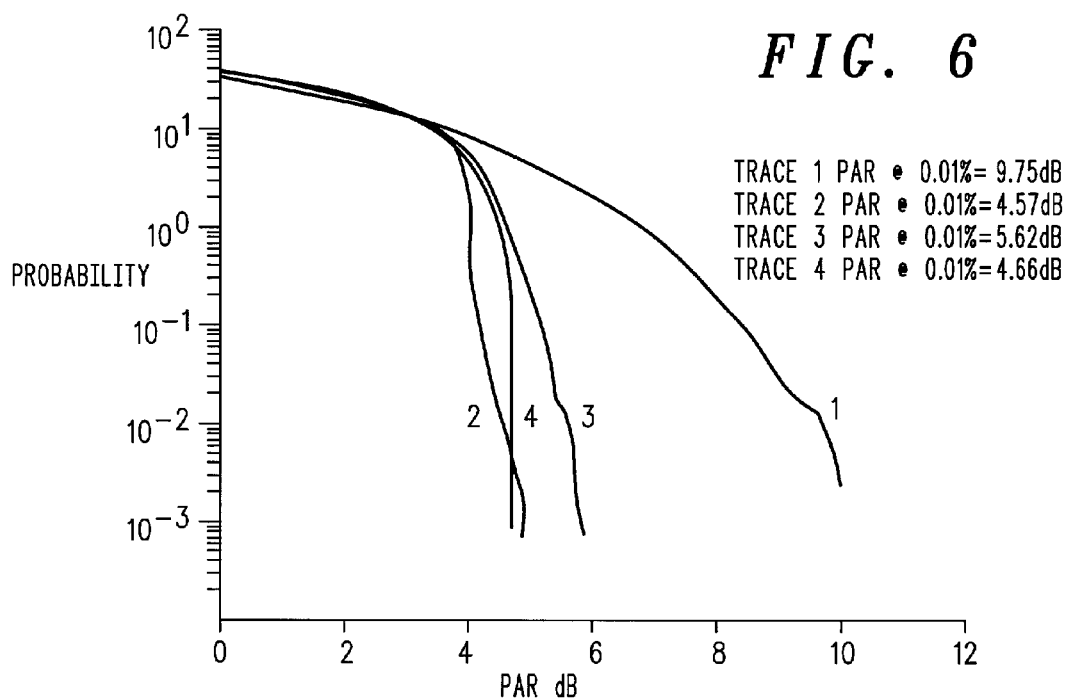

FIG. 6 shows how the peak-to-average ratio changes throughout the processing chain. See the Table below for a summary of various information relevant to the waveforms of FIG. 6. The changes in the peak-to-average ratio can be broken down into changes in the peak power and changes in average power, as shown in the table below. Using waveform 1 as the reference we can see that the clipping operation performed by clipping function 301 as depicted in waveform 2 greatly reduces the peak power of the signal while reducing the average power to a lesser extent. After the signal has been filtered, waveform 3, the average falls slightly due to attenuation in the pass band of the filter, but the peaks increase due to changes in the signal in the complex plane. In an attempt to regain some of the lost PAR reduction, the signal is clipped, albeit lightly, a second time. The result is another dB of reduction in the peak power while the average power remains relatively unchanged as shown in waveform 4.

|  | Point 1 | Point 2 | Point 3 | Point 4 |
| --- | --- | --- | --- | --- |
| Peak Power (dB) | 0 | −6.430 | −5.754 | −6.909 |
| Peak Power @ 0.01% (dB) | 0 | −6.435 | −5.655 | −66.29 |
| Avg Power (dB) | 0 | −1.255 | −1.525 | −1.539 |

Using the peak reduced waveforms as inputs to a power amplifier the following improvement were measured. At rated output power the clipped waveforms had 6 to 7 dB better ACP performance while maintaining the same efficiency as the non-clipped waveforms. Running the power amplifier an additional 3 dB over rated power with the clipped waveform as the input resulted in an ACP that was identical to the power amplifier running at rated power with the non-clipped waveforms. Driving the power amplifier 3 dB harder resulted in a 50% improvement in efficiency. These results are typical but may vary depending on how much the power amplifier is backed off.

As a summary and in the context of the methodology that we have discussed with reference to the apparatus figures the following description of a preferred method is provided. We have discussed and described a method of reducing peak power requirements in a multi-channel transmitter. This method includes coupling at least one input signal to a Fourier Transform Matrix (FTM), preferably a digital FTM, to provide a plurality of FTM output signals each comprising a combination of phase shifted versions of the one or more input signals. Then the method processes the plurality of FTM output signals by limiting a peak value for each of the FTM output signals to provide a plurality of peak limited output signals and then converts the peak limited output signals from a base band frequency to a transmission radio frequency to provide a plurality of radio frequency signals. Thereafter amplifying the plurality of radio frequency signals using a multi-channel amplifier to provide a plurality of amplified output signals is undertaken and finally coupling the amplified output signals to a radio frequency or analog FTM that is operable to provide at least one transmit signal corresponding one to one with the at least one input signal completes the basic method.

Preferably coupling at least one input signal actually includes coupling a plurality of base band signals, such as code division, time division, or frequency division multiple access base band signals, intended for transmission on a radio channel, such as transmission within a sector of a plurality of sectors. Processing the FTM output signals further comprises clipping, preferably using a windowed clipping function as discussed above, each of the FTM output signals according to a predetermined function that lowers the probability that any peak value will exceed a predetermined value for each of the FTM output signals. This clipping is preferably followed by filtering each of the FTM output signals, as clipped, to reduce undesired signals resulting from the clipping. After filtering an additional step of clipping, preferably lightly using the windowed clipping approach, to further limit peaks of a filtered version of each of the FTM output signals may be undertaken. This method may be used advantageously for transmitting code division, time division, or frequency division, time division, or frequency division multiple access signals on multiple sectors or multiple carriers on multiple sectors.

The methods and apparatus, discussed above, and the inventive principles and concepts thereof are intended to and will alleviate problems caused by prior art transmitters using FTMs and conventional base band processing techniques. Using these principles of developing at base band signals that are faithful representations of signals that power amplifiers will see at their input and processing those signals for lower or reduced peak to average ratios has shown a dramatic improvement in transmitter performance.

Various embodiments of method and apparatus for reducing peak to average ratios and particularly improving crest factors so as to facilitate and provide for improved transmitter performance and reduced peak power requirements for the transmitters have been discussed and described. It is expected that these embodiments or others in accordance with the present invention will have application to many wide area networks. Using the inventive principles and concepts disclosed herein advantageously allows or provides for low cost high availability multi-channel transmitters that will be required for current and future communications systems and this will be beneficial to both users and providers of such systems.

This disclosure is intended to explain how to fashion and use various embodiments in accordance with the invention rather than to limit the true, intended, and fair scope and spirit thereof. The invention is defined solely by the appended claims, as may be amended during the pendency of this application for patent, and all equivalents thereof.

What is claimed is:

1. A peak to average reduction apparatus for reducing peak power requirements of a multi-channel transmitter, the apparatus comprising in combination:

a Fourier Transform Matrix (FTM) coupled to at least one input signals for providing a plurality of output signals each comprising a combination of phase shifted versions of said at least one input signals;

a processing unit coupled to said plurality of output signals for limiting a peak value for each of said plurality of output signals to provide a plurality of peak limited output signals, wherein said processing unit further comprises a clipping function that operates to limit peaks of said each of said plurality of output signals, wherein said clipping function is a windowed clipping function that operates to limit peaks according to a predetermined function that lowers the probability that said peak value will exceed a predetermined value for said each of said plurality of output signals; and wherein said plurality of peak limited output signals are suitable for generating a plurality of low level signals for driving the multi-channel transmitter.

2. A peak to average reduction apparatus for reducing peak power requirements of a multi-channel transmitter, the apparatus comprising in combination:
- a Fourier Transform Matrix (FTM) coupled to at least one input signals for providing a plurality of output signals each comprising a combination of phase shifted versions of said at least one input signals;
- a processing unit coupled to said plurality of output signals for limiting a peak value for each of said plurality of output signals to provide a plurality of peak limited output signals, wherein said processing unit further comprises a clipping function that operates to limit peaks of said each of said plurality of output signals, wherein said processing unit further comprises a filter coupled to an output of said clipping function to reduce undesired signals resulting from said clipping function; and
- wherein said plurality of peak limited output signals are suitable for generating a plurality of low level signals for driving the multi-channel transmitter.

3. The peak to average reduction apparatus of claim 2 wherein said processing unit further comprises a second clipping function coupled to an output of said filter that operates to further limit peaks of said each of said plurality of output signals.

4. A multi-channel transmitter having reduced peak power requirements comprising in combination:
- a Fourier Transform Matrix (FTM) coupled to at least one input signal for providing a plurality of FTM output signals each comprising a combination of phase shifted versions of said at least one input signal;
- a processing unit coupled to said plurality of FTM output signals for limiting peak value for each of said plurality of FTM output signals to provide a plurality of peak limited output signals, wherein said processing unit further comprises a clipping function that operates to limit peaks of said each of said plurality of FTM output signals, wherein said clipping function is a windowed clipping function that operates to limit peaks according to a predetermined function that lowers the probability that said peak value will exceed a predetermined value for said each of said plurality of FTM output signals;
- a power amplifier having a plurality of amplifiers coupled to a plurality of signals, each amplifier having an input coupled to a one of said plurality of said signals corresponding to one of said peak limited output signals to provide an amplified output signal, wherein said plurality of amplifiers provide a plurality of amplified output signals; and
- a radio frequency FTM coupled to said plurality of amplified output signals to provide at least one transmit signal corresponding one to one with said at least one input signal.

5. A multi-channel transmitter having reduced peak power requirements comprising in combination;
- a Fourier Transform Matrix (FTM) coupled to at least one input signal for providing a plurality of FTM output signals each comprising a combination of phase shifted versions of said at least one input signal;
- a processing unit coupled to said plurality of FTM output signals for limiting a peak value for each of said plurality of FTM output signals to provide a plurality of peak limited output signals, wherein said processing unit further comprises a clipping function that operates to limit peaks of said each of said plurality of FTM output signals, wherein said processing unit further comprises a filter coupled to an output of said clipping function to reduce undesired signals resulting from said clipping function;
- a power amplifier having a plurality of amplifiers coupled to a plurality of signals, each amplifier having an input coupled to a one of said plurality of said signals corresponding to one of said peak limited output signals to provide an amplified output signal, wherein said plurality of amplifiers provide a plurality of amplified output signals, and
- a radio frequency FTM coupled to said plurality of amplified output signals to provide at least one transmit signal corresponding one to one with at least one input signal.

6. The multi-channel transmitter of claim 5 wherein said processing unit further comprises a second clipping function coupled to an output of said filter that operates to further limit peaks of a filtered version of said each of said plurality of FTM output signals.

7. A method of reducing peak power requirements in a multi-channel transmitter, the method including the steps of:
- coupling at least one input signal to a Fourier Transform Matrix (FTM) to provide a plurality of FTM output signals each comprising a combination of phase shifted versions of said at least one input signal;
- processing said plurality of FTM output signals by limiting a peak value for each of said plurality of said FTM output signals to provide a plurality of peak limited output signals, wherein said processing said plurality of said FTM output signals further comprises clipping said each of said plurality of said FTM output signals according to a predetermined function that lowers the probabity that said peak value will exceed a predetermined value for said each of said plurality of said FTM output signals, and wherein said processing said plurality of said FTM output signals further comprises, after said clipping said each of said plurality of said FTM output signals, filtering said each of said plurality of said FTM output signals to reduce undesired signals resulting from said clipping;
- converting said plurality of said peak limited output signals from a base band frequency to a transmission radio frequency to provide a plurality of radio frequency signals,
- amplifying said plurality of radio frequency signals using a plurality of amplifiers to provide a plurality of amplified output signals; and
- coupling said plurality of amplified output signals to a radio frequency FTM that is operable to provide at least one transmit signal corresponding one to one with said at least one input signal.

8. The method of claim 7 wherein said processing said plurality of said FTM output signals further comprises, after said filtering said each of said plurality of said FTM output signals, a second step of clipping to further limit peaks of a filtered version of said each of said plurality of said FTM output signals.

9. The method of claim 8 performed for transmitting one of a code division, frequency division, and time division multiple access signals on multiple sectors and wherein said FTM is a digital base band FTM, said processing uses a windowed clipping function, and said radio frequency FTM is an analog FTM.

* * * * *